(12) United States Patent
Tao et al.

(10) Patent No.: US 9,406,373 B2
(45) Date of Patent: Aug. 2, 2016

(54) MEMORY ARRAY AND METHOD OF OPERATING THE SAME

(71) Applicant: TAIWAN SEMICONDUCTOR MANUFACTURING COMPANY, LTD., Hsinchu (TW)

(72) Inventors: Derek C. Tao, Fremont, CA (US); Bing Wang, Palo Alto, CA (US); Kuoyuan (Peter) Hsu, San Jose, CA (US); Jacklyn Chang, San Ramon, CA (US); Young Suk Kim, Fremont, CA (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/805,694

(22) Filed: Jul. 22, 2015

(65) Prior Publication Data

US 2015/0325287 A1     Nov. 12, 2015

Related U.S. Application Data

(63) Continuation of application No. 14/279,424, filed on May 16, 2014, now Pat. No. 9,099,201, which is a continuation of application No. 13/627,108, filed on Sep. 26, 2012, now Pat. No. 8,760,948.

(51) Int. Cl.

| G11C 7/02 | (2006.01) |
|---|---|
| G11C 11/419 | (2006.01) |
| G11C 7/08 | (2006.01) |
| G11C 7/22 | (2006.01) |
| G11C 5/02 | (2006.01) |
| G11C 5/06 | (2006.01) |
| G11C 7/18 | (2006.01) |

(52) U.S. Cl.
CPC ............... *G11C 11/419* (2013.01); *G11C 7/08* (2013.01); *G11C 7/227* (2013.01); *G11C 5/025* (2013.01); *G11C 5/063* (2013.01); *G11C 7/18* (2013.01)

(58) Field of Classification Search
CPC ....................................... G11C 1/419
USPC ....................................... 365/210.1
See application file for complete search history.

(56) References Cited

U.S. PATENT DOCUMENTS

| 8,300,491 | B2 | 10/2012 | Tao et al. |
|---|---|---|---|
| 8,605,523 | B2 | 12/2013 | Tao et al. |
| 8,619,478 | B2 | 12/2013 | Lum et al. |
| 8,934,308 | B2 | 1/2015 | Wang |
| 8,964,492 | B2 * | 2/2015 | Hsu .................. G11C 11/419 365/191 |
| 2007/0008771 | A1 * | 1/2007 | Lee .................. G11C 7/14 365/154 |
| 2013/0088926 | A1 | 4/2013 | Tao et al. |
| 2014/0010032 | A1 | 1/2014 | Seshadri et al. |

* cited by examiner

*Primary Examiner* — Son Mai
(74) *Attorney, Agent, or Firm* — Hauptman Ham, LLP

(57) ABSTRACT

A memory array includes an array of memory cells. The memory array further includes at least two read tracking cells in a read tracking column. The memory array further includes a read tracking circuit coupled to the at least two read tracking cells, wherein the read tracking circuit is configured to generate a global tracking result signal based on outputs from the at least two read tracking cells. The memory array further includes memory control circuitry, wherein the memory control circuitry is configured to reset a memory clock based on the global tracking result signal.

20 Claims, 11 Drawing Sheets

MEMORY ARRAY AND METHOD OF OPERATING THE SAME

PRIORITY CLAIM

The present application is a continuation of U.S. application Ser. No. 14/279,424, filed May 16, 2014, now U.S. Pat. No. 9,099,201, issued Aug. 4, 2015, which is a continuation of U.S. application Ser. No. 13/627,108, filed Sep. 26, 2012, now U.S. Pat. No. 8,760,948, issued Jun. 24, 2014, which are incorporated herein by reference in their entireties.

RELATED APPLICATIONS

The present application is related to U.S. application Ser. No. 12/868,909, entitled "Multiple Bitcells Tracking Scheme for Semiconductor Memories," filed on Aug. 26, 2010, which is incorporated herein by reference in its entirety.

BACKGROUND

Semiconductor memory devices are continually shrinking in size while at the same time increasing in density or volume and operating at a lower power. The operations of memory devices are synchronized based on clock signals, which may reach different parts of a memory device at different times. The difference in signal paths results in various problems including a reduced read time margin, which may lead to data being improperly read from the memory.

Read tracking circuits for memory cells provide signals based on which read signals for memory cells having data written therein are generated. Generally, the read tracking circuits are designed such that the worst case condition for reading memory cells is covered. For advanced semiconductor memory devices, designing proper read tracking circuits is a challenge.

DETAILED DESCRIPTION

One example of a semiconductor memory device, a static random access memory (SRAM), includes a plurality of memory cells arranged in rows and columns. Each memory cell typically includes four or six transistors that form a latch for storing a bit of information. Additionally, each memory cell is connected to one of a plurality of write word lines (WWL) and one of a plurality of read word lines (RWL), both of which extend horizontally across an SRAM array forming a plurality of rows. The memory cells are also coupled to one of a plurality of differential write bit line including WBL and its inverse WBL_. A read bit line (RBL) is also coupled to the memory cells. WBL_, WBL_, and RBL all extend vertically across the SRAM array to form a plurality of columns.

Data is written to the memory cells by controlling the voltages on the WWL and providing the data on bit lines WBL and WBL_ to be transferred to the storage node. Data is read from the memory cells by controlling a voltage of the RWL and sensing a resultant voltage that develops on the RBL. The process of writing data to and reading data from the memory cells takes a certain amount of time, which varies based on a distance between the memory cell and the memory controller as well as on the variances across the SRAM due to process, voltage, and temperature ("PVT").

Consequently, SRAM arrays, and other semiconductor memories such as dynamic random access memories ("DRAMs"), also include tracking circuitry to detect delays in signals transmitted through the array. The delays detected through the use of tracking signals are used to adjust the timing of the memory control signals to help ensure the read time margin is sufficient such that data may be properly read from the memory. Although multiple bit cell tracking methods have been implemented to reduce the variations (e.g., in threshold voltage, in memory cell read current, etc.) across the SRAM, problems still arise when the memory is implemented for a wide operating voltage range and high speed. In these situations, the tracking may be too fast for low $V_{DD}$ operation due to different threshold voltages ($V_T$) between the logic and the bit lines. Additionally, in some approaches, if the tracking methodology is implemented for low $V_{DD}$ operation, then the tracking may result in too large a read time margin and therefore will not be optimized for normal $V_{DD}$ operation.

Figure 1:
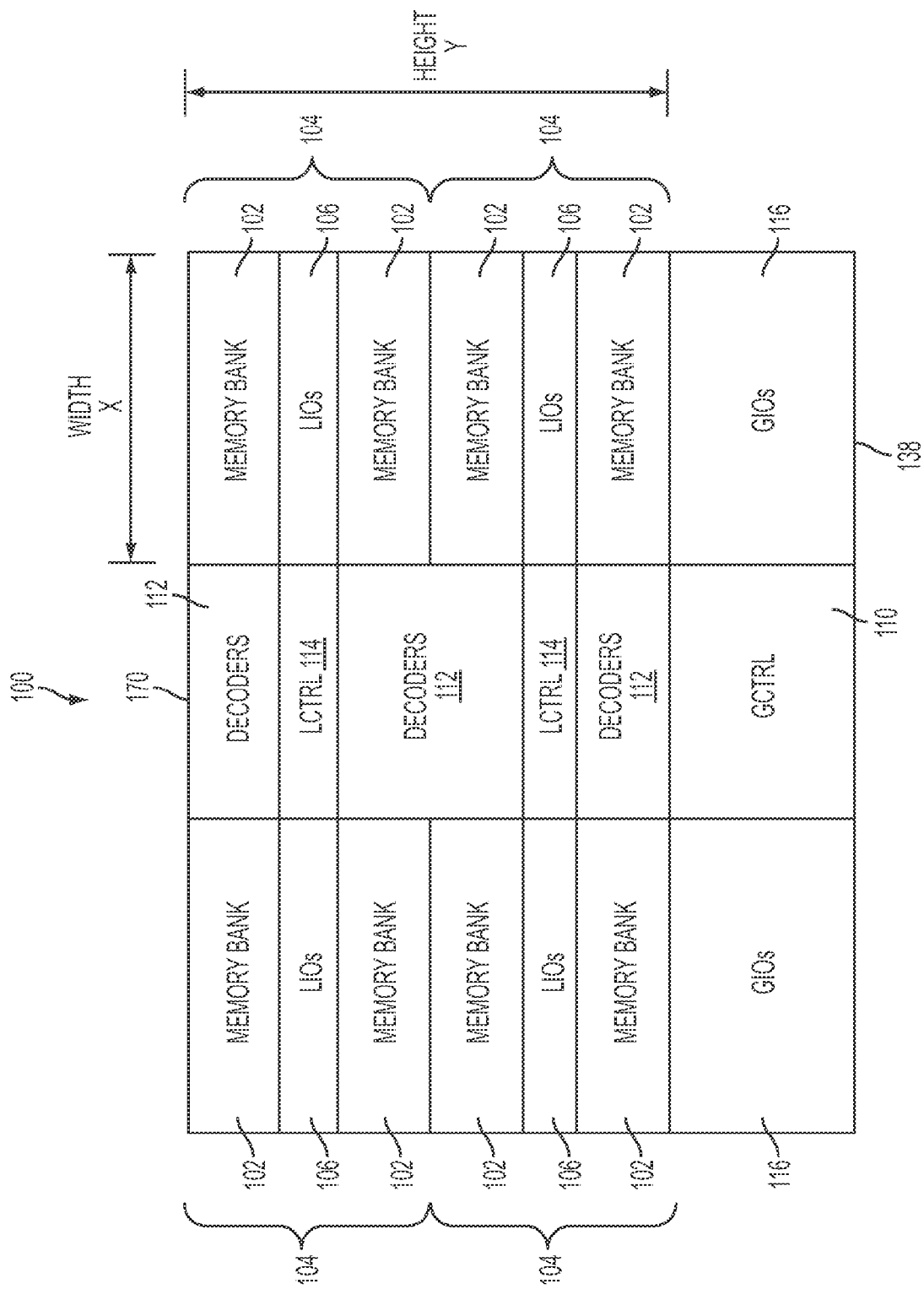
FIG. 1 illustrates a layout of a semiconductor memory in accordance with some embodiments.

FIG. 1 illustrates a static random access memory ("SRAM") array 100, in accordance with some embodiments. SRAM array 100 includes a number of memory banks 102, which are made of memory cells. Although an SRAM array is described, one skilled in the art will understand that the disclosed system and method may be adapted for other semiconductor memories including, but not limited to, dynamic random access memories ("DRAMs"), erasable programmable read only memories ("EPROMs"), and electronically erasable programmable read only memories ("EEPROMs") as well as other read only memories ("ROMs"), random access memories ("RAMs"), and flash memories. SRAM array 100 may be divided into one or more segments 104 with each segment 104 including a plurality of memory banks 102 separated by local input/output (LIO) circuits 106. The reading from and writing to the memory cell banks 102 is controlled by global control ("GCTRL") circuit 110, which is coupled to address decoders 112, local control ("LCTRL") circuit 114, and global input/output ("GIO") circuits (GIOs) 116. For example, GCTRL circuit 110, which may include a clock (or two clocks, one for read and one for write) for controlling the reading and writing to and from memory cells of the SRAM 100, provides an address and a control signal for reading data from or writing data to a memory cell in one of the segments 104. The address is decoded by one of the decoders 112. A LCTRL circuit 114 identifies a type of operation being performed and transmits a signal to an LIO 106 for controlling the data access in a segment 104. Decoders 112, LCTRL 114 and GCTRL 110 are placed in a control region 170 in a central region of SRAM array 100. For illustration, one memory array on the right side is labeled as memory array 138, which has a width X and a height Y.

Figure 2:
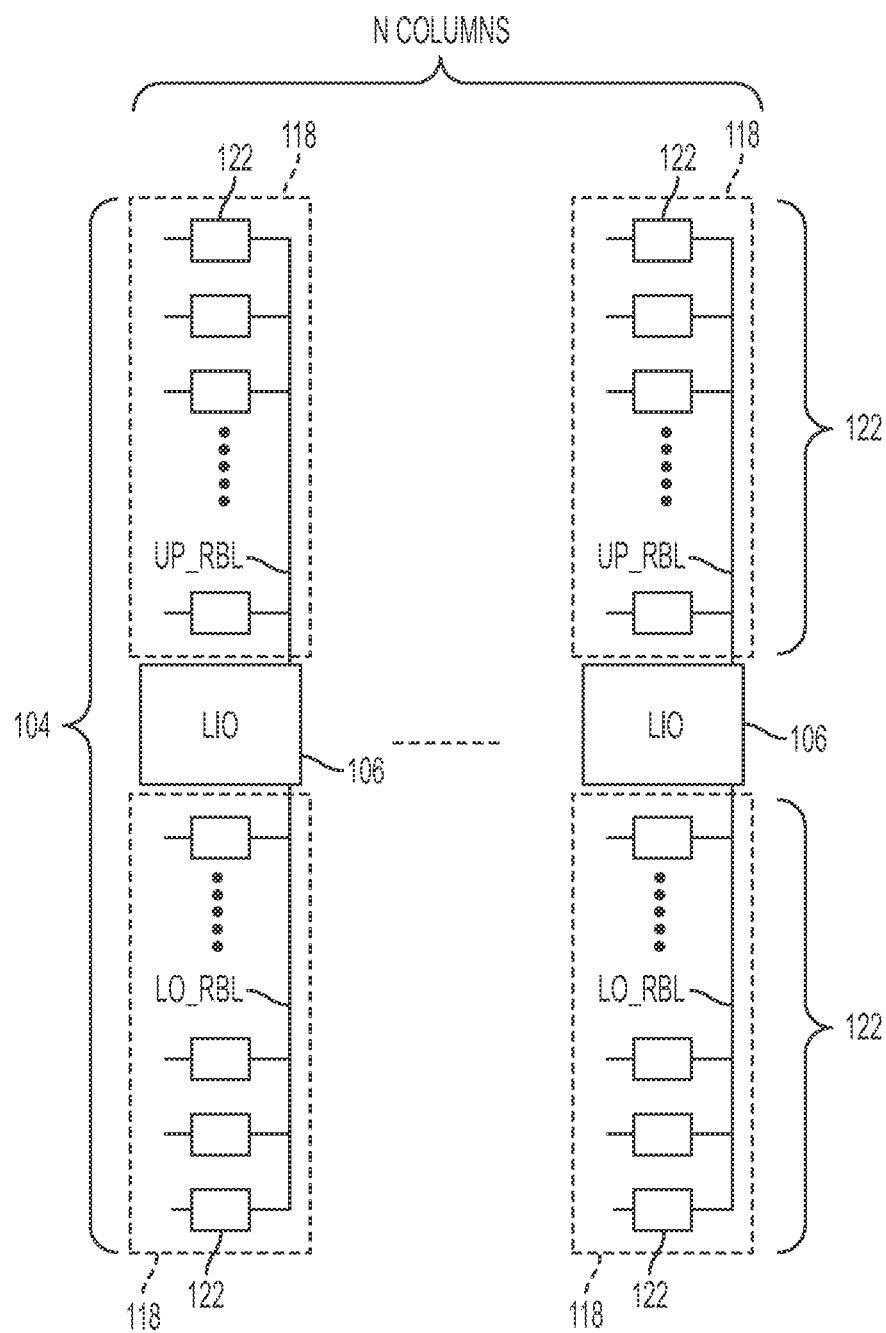
FIG. 2 illustrates a more detailed view of one example of a segment of a static random access memory (SRAM), in accordance with some embodiments.

FIG. 2 illustrates a more detailed view of one example of a portion of segment 104 of SRAM 100. As shown in FIG. 2, segment 104 includes N columns 118 of memory cells 122 arranged in rows and coupled to LIO 106. Memory cells 122 disposed in columns 118 disposed above LIOs 106 are coupled to read bit line UP_RBL, and memory cells 122 disposed in columns 118 below the LIOs 106 are coupled to read bit line LO_RBL. UP_RBL and LO_RBL, via the output of tracking LIOs 106, are coupled to a global bit line ("GBL") 255 (as depicted in FIG. 4).

Figure 3:
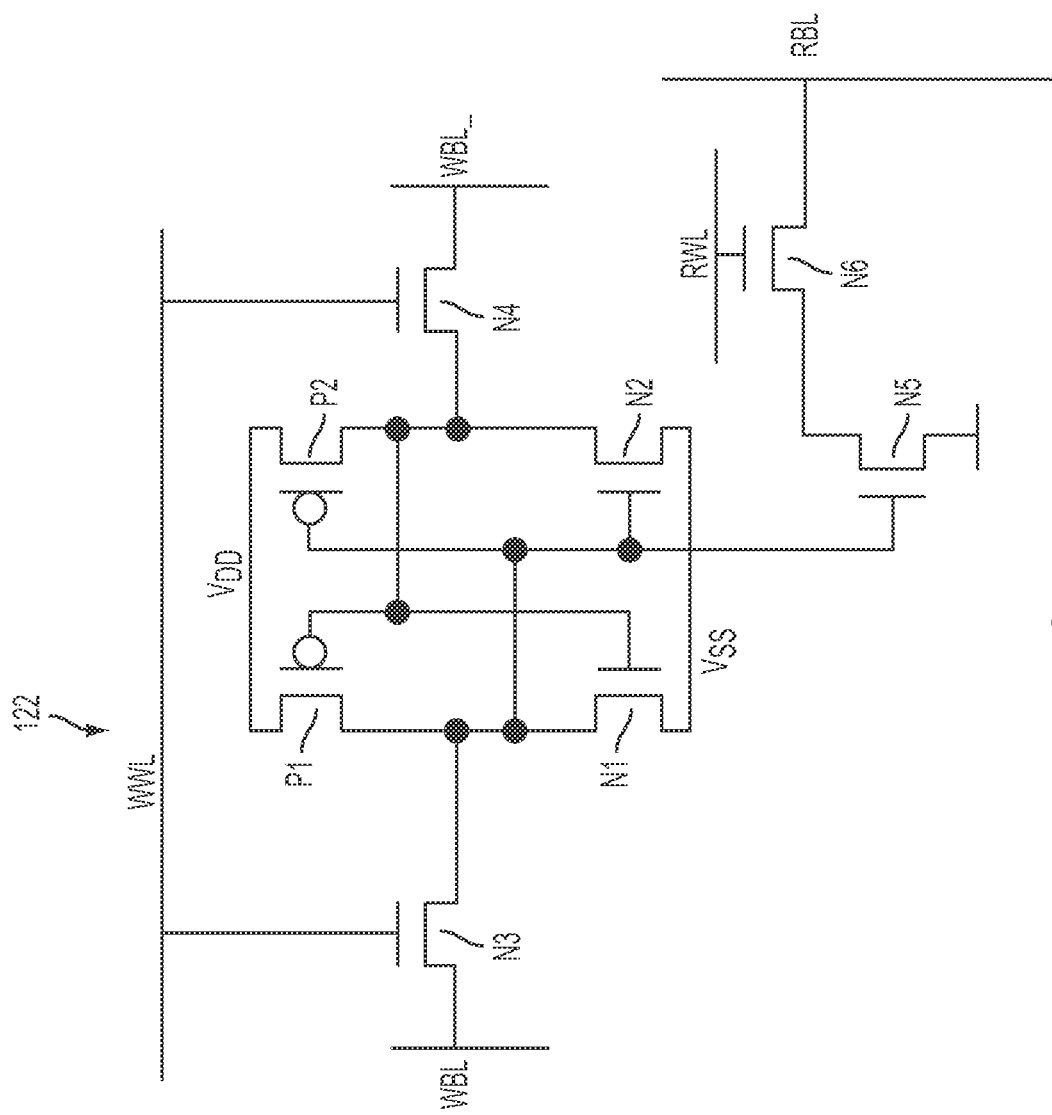
FIG. 3 is a schematic view of one example of a memory cell in accordance with some embodiments of a semiconductor memory.

FIG. 3 illustrates a single-ended SRAM memory cell 122, in accordance with some embodiments. SRAM memory cells 122 are the memory cells in SRAM array 100, in some embodiments. As shown in FIG. 3, memory cell 122 includes two PMOS transistors P1 and P2 and six NMOS transistors N1-N6. Each memory cell 122 is connected to one of a plurality of write word lines (WWL) and one of a plurality of read word lines (RWL), both of which extend horizontally across an SRAM array forming a plurality of rows. Memory cell 122 is also coupled to one of a plurality of differential write bit line including WBL and its inverse WBL_. A read bit line (RBL) is also coupled to memory cell 122. WBL, WBL_, and RBL all extend vertically across the SRAM array 100 to form a plurality of columns.

Memory writing is accomplished by placing a high level (e.g., a logic one ("1")) on the addressed WWL and the desired logic level on the write bit lines WBL and WBL_. The desired value is latched through pass NMOS transistors N3 and N4 where it is then stored at a storage node disposed between transistors P1-P2 and N1-N2. Memory reading is accomplished by accessing the value stored at the storage node by placing a high level on the addressed RWL and detecting a logic level on the RBL through NMOS transistor N6.

Figure 4:
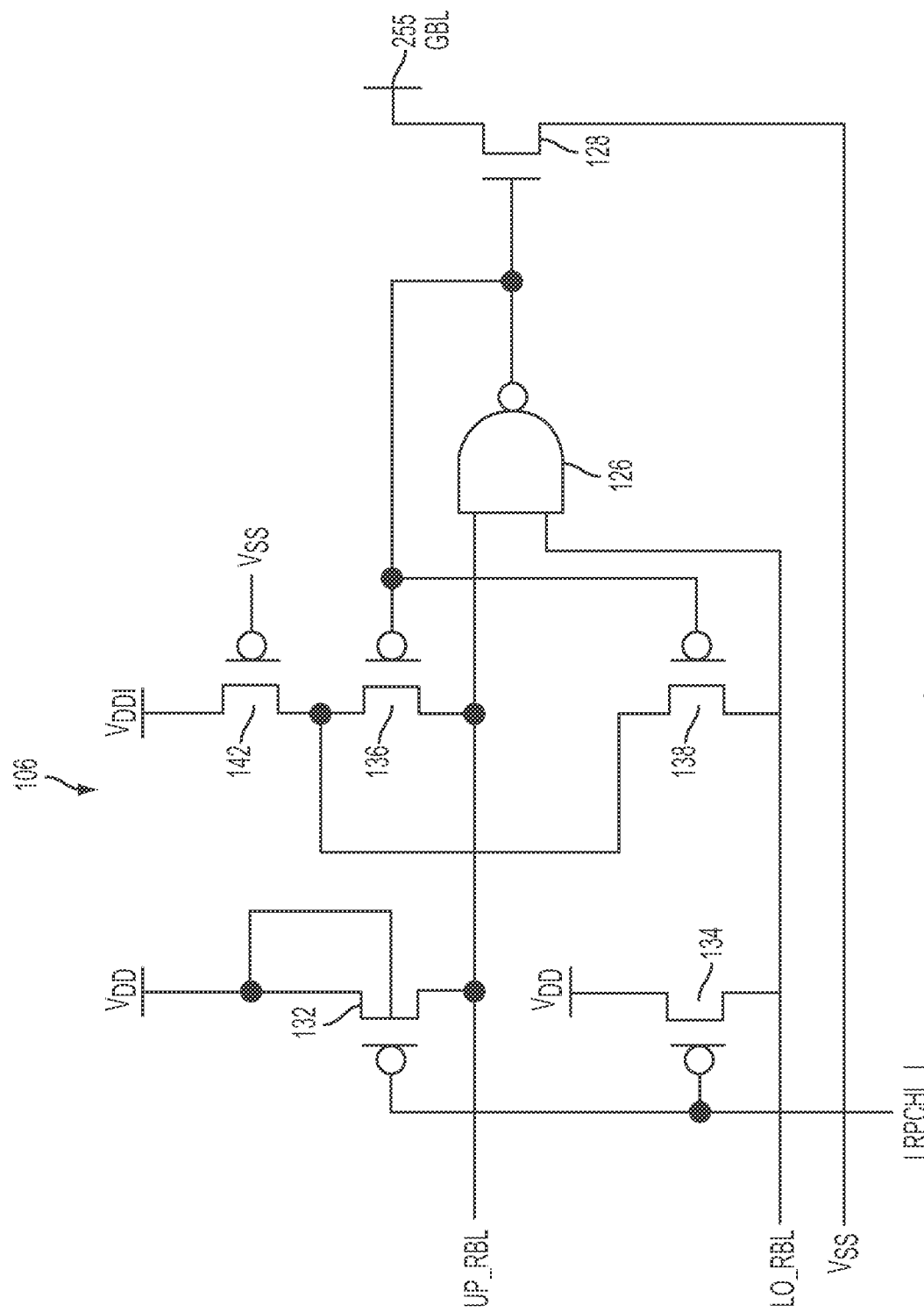
FIG. 4 illustrates a local input/output circuit in accordance with some embodiments.

One embodiment of an LIO 106 is illustrated in FIG. 4. As shown in FIG. 4, LIO 106 includes a NAND logic gate 126 having a first input coupled to a first RBL, which may be disposed above LIO 106 as illustrated in FIG. 2 and is thus identified as UP_RBL, and a second input coupled to a second RBL disposed below LIO 6 and is identified as LO_RBL. The output of NAND gate 126 is coupled to GBL 255 through transistor 128. Transistors 132-138 and 142 are coupled to positive voltage supply $V_{DD}$ and negative voltage supply $V_{SS}$ to provide the appropriate logic voltage levels to NAND gate 126. During standby mode, LRPCHL_L signal is set to "low" and local bit lines, UP_RBL and LO_RBL, are pre-charged to VDD. During a read operation, LRPCHL_L is set to "high" to turn off transistors 132 and 134.

Figure 5:
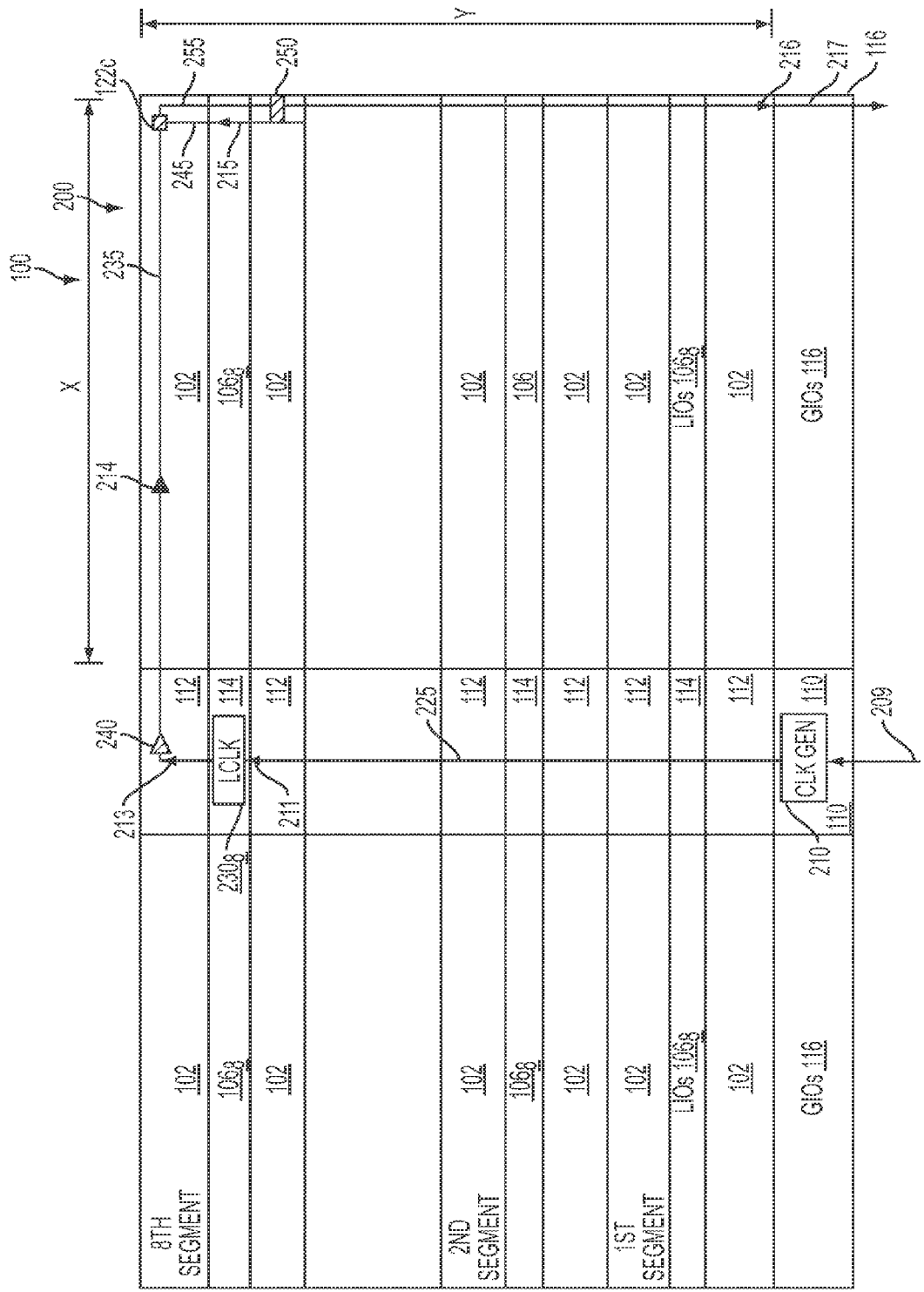
FIG. 5 shows a read path of a corner memory cell, in accordance with some embodiments.

FIG. 5 shows a read path 200 of a corner memory cell $122_C$ in SRAM 100, in accordance with some embodiments. In the embodiment of FIG. 5, there are 8 segments in SRAM 100 and corner cell $122_C$ is in the $8^{th}$ segment, which is a segment farthest away from GCTRL circuit 110. The reading of the corner memory cell $122_C$ is used in the embodiments to provide a worst case in terms of distance from a read controller, which is part of the GCTRL circuit 110. As mentioned above, the read tracking circuits are designed such that the worst case condition for reading memory cells is covered.

The read path 200 starts when a read global clock (RGCLK) signal 211 is generated by a clock generator (CLK GEN) 210 in GCTRL circuit 110. The generation of the RGCLK signal 211 is initiated by an external read clock signal 209 generated by a read driver (not shown) to initiate the read operation. The read driver is part of a memory controller (also not shown). The RGCLK signal 211 travels along a vertical signal line 225, which runs parallel to bit lines, to a local clock generator (LCLK GEN) $230_8$ of LCTRL circuit $114_8$ in the $8^{th}$ segment, as shown in FIG. 5. LCLK GEN $230_8$ then generates (or triggers) a local clock signal 213, which is routed through a series of LCTRL circuitry 114 and decoders 112 in $8^{th}$ segment to a word line driver 240 of the read word line (RWL) 235 of corner cell $122_C$. Word line driver 240 enhances the local clock signal 213 to become a read control signal 214. The read control signal 214 travels along RWL 235 to the corner memory cell $122_C$, which enables generating a local read result signal 215. The total distance of sequential signals 211, 213, 214 before signal 214 reaches word line driver 240 is about the height Y of the SRAM array 100. The distance of RWL 235 traveled by the read control signal 214 is about with the width X of the SRAM array 100, which is the worst-case horizontal travel distance for any memory cells 122 in SRAM array 100.

The local read result signal 215 then travels along a local bit line (LBL) 245 for corner cell $122_C$ to LIO $106_8$ of the $8^{th}$ segment, which routes the local read result signal 215 to a global bit line driver (GBLD) 250 in LIO $106_8$. (GBLD) 250 in LIO $106_8$ transforms the local read result signal 215 into global read result signal 216. The global read result signal 216 travels along a global bit line (GBL) 255 to GIO circuits (or GIOs) 116 and becomes an output data signal 217. The total distance traveled by the local read result signal 215 and the GIOs 216 is about the height Y of SRAM array 100. The total vertical distance traveled by signals between the output data signal 217 and external clock signal (i.e., RGCLK signal 211) is 2Y, which is the worse-case vertical travel distance for reading memory cells in SRAM array 100.

Read path 200 described above involves various signal transformations, such as through (circuit) components CLK GEN 210, LCLK 230, word line driver 240, memory cell $122_C$, GBLD 250 and GIOs 116 and the paths, such as signal line 225, RWL 235, LBL 245, and GBL 255. Each component and each path could affect the read time. For advanced memory devices, the requirements on the speeds of read and/or write memory cells have become more stringent. Therefore, the available read and write times have been reduced. As a result, some existing schemes of using extra margins for read tracking of memory devices would not meet the speed requirements. A read tracking scheme that mimics a worst-case read path of memory cells 110 in array 100 with some built-in margin would be more accurately providing sufficient read time margin without unnecessarily extra read time margin to degrade the read speed.

Figure 6:
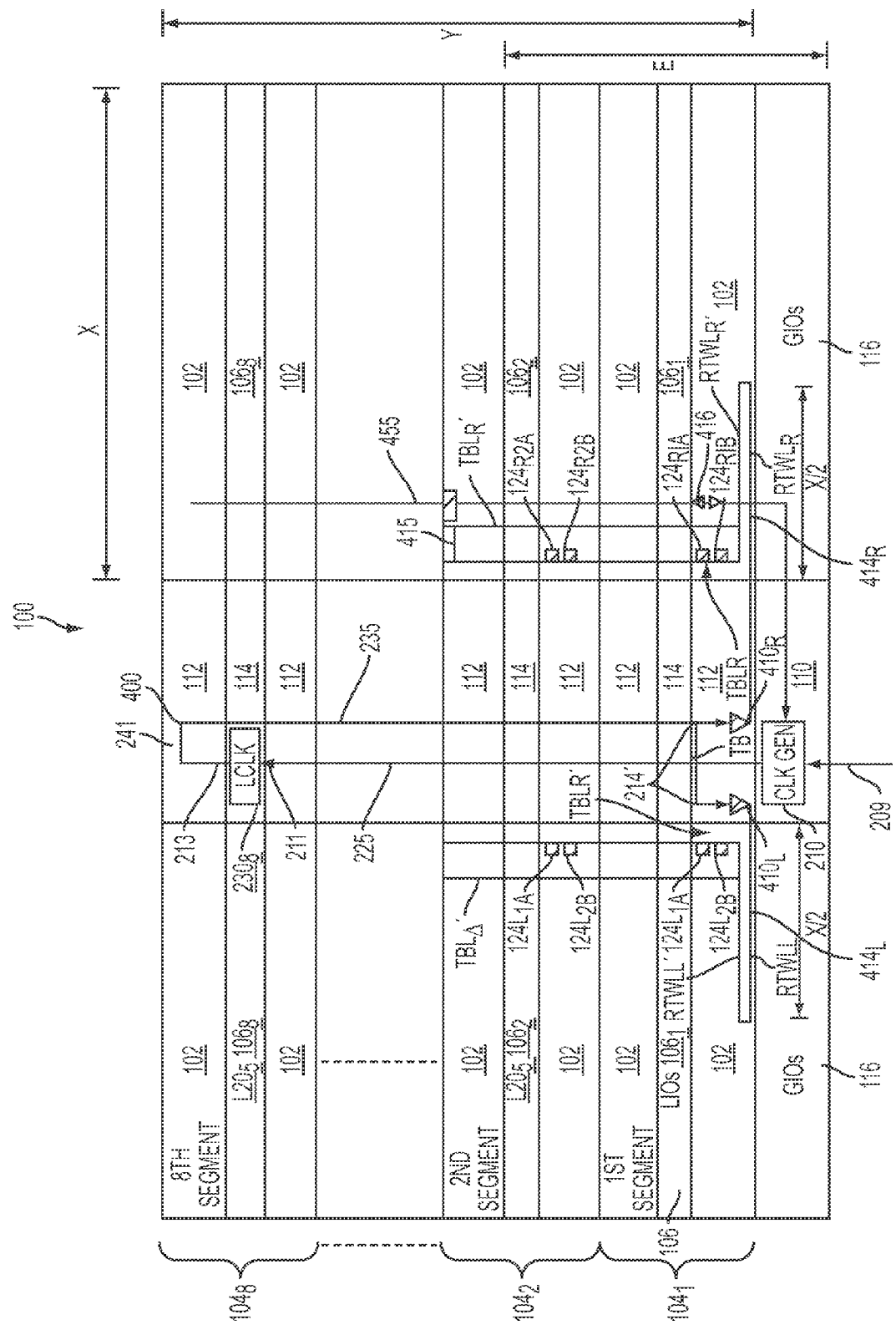
FIG. 6 shows a read tracking path of a memory array, in accordance with some embodiments.

FIG. 6 illustrates a read tracking path 400 for SRAM array 100, in accordance with some embodiments. The read tracking path 400 starts similar to read path 200 initially with a read global clock (RGCLK) signal 211 is generated by a clock generator (CLK GEN) 210 in GCTRL circuit 110. The RGCLK signal 211 travels along a vertical signal line 225, which runs parallel to bit lines, to a local clock generator (LCLK GEN) $230_8$ of LCTRL circuit $114_8$ in the $8^{th}$ segment, as shown in FIG. 6. LCLK GEN $230_8$ then generates (or triggers) a local clock signal 213, which is the input of a buffer 241 of RWL 235. Buffer 241 enhances the local clock signal 213 to become read tracking signals 214', which reach drivers $410_R$ and $410_L$, which mimic word line driver 240. Drivers $410_R$ and $410_L$ enhance read tracking control signals $414_R$ and $414_L$ for right (R) side and left (L) side of SRAM array 100 respectively, as shown in FIG. 6. Drivers $410_R$ and $410_L$ are located near the edge of decoder 114 of the 1st segment and are near the GCTRL 110, in accordance with some embodiments. The distance of signal line 225 is about the height Y of SRAM array 100. As a result, the read tracking path 400 has covered a vertical distance of Y so far. The vertical distance of RWL 235, about Y, provides margin for tracking signal.

Read tracking control signal $414_R$ then travels along a read tracking word line ($RTWL_R$), which runs the distance of about half of the width (X/2) of SRAM array 100 and returns on an adjacent read tracking word line ($RTWL_R'$). $RTWL_R'$ also runs the distance of about half of the width (X/2) of SRAM array 100. Therefore, the total horizontal (or the direction parallel to word lines) distance traveled by signal $414_R$ is the width X of SRAM array 100.

Figure 7:
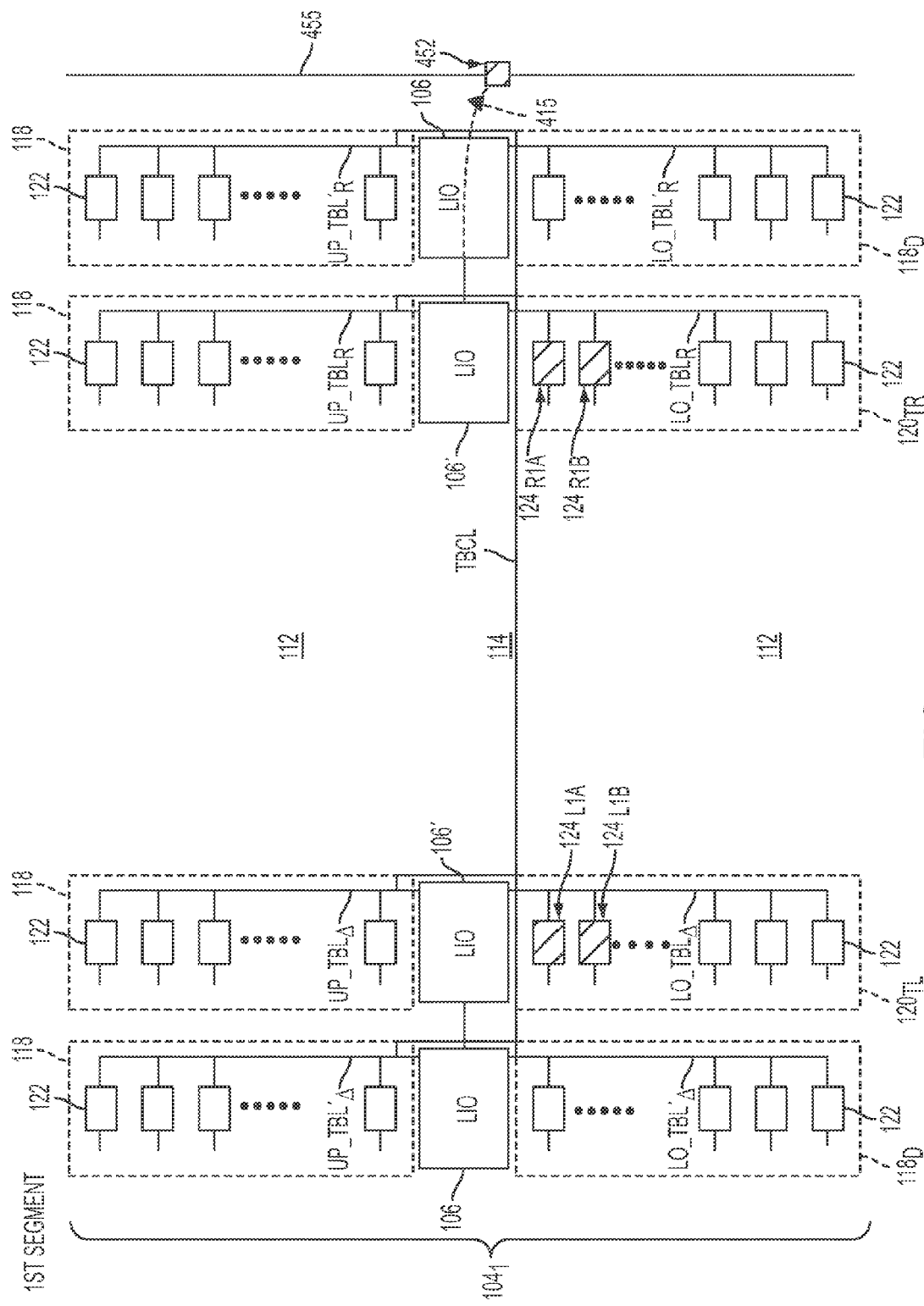
FIG. 7 illustrates a layout of a partial segment of a semiconductor memory in accordance with some embodiments.

Signal $414_R$ then travels along a vertical signal line (not shown) to reach tracking cells (or tracking bit cells) $124_{R1A}$, $124_{R1B}$, $124_{R2A}$, and $124_{R2B}$, as shown in FIG. 6. Tracking cells $124_{R2A}$ and $124_{R2B}$ are in the 2nd segment and on right side of SRAM array 100. Tracking cells $124_{R2A}$ and $124_{R2B}$ are adjacent to each other, with $124_{R2B}$ below $124_{R2A}$. Similarly, Tracking cells $124_{R1A}$ and $124_{R1B}$ are in the 1st segment and on right side of SRAM array 100 and they are also adjacent to each other, as shown in FIG. 7 in accordance with some embodiments. Tracking bit lines ($TBL_R$) are connected to a dummy local tracking bit line ($TBL_R'$), which are similar to $TBL_R$, to double (or two times) the loading of tracking bit line ($TBL_R$), in accordance with some embodiments. The dummy local tracking bit line ($TBL_R'$) is a bit line for a dummy column, whose memory cells are not used. By connecting $TBL_R'$ to $TBL_R$, the loading of $TBL_R$ is doubled, which provides margin for resistance-capacitance (RC) delay in the local tracking bit line. The dummy cells of the dummy columns double the capacitance of read tracking columns. Therefore, the RC delay is doubled with the extra RC as the margin.

Similarly, read tracking control signal $414_L$ travels along a vertical signal line (not shown) to reach tracking cells $124_{L1A}$, $124_{L1B}$, $124_{L2A}$, and $124_{L2B}$, in a manner similar to signal $414_R$. Tracking bit line ($TBL_L$) is also connected to a dummy tracking bit line ($TBL_L'$) to double the loading of Local tracking bit line ($TBL_L$). Signals $414_R$ and $414_L$ are sent to tracking cells $124_{R1A}$, $124_{R1B}$, $124_{R2A}$, and $124_{R2B}$, $124_{L1A}$, $124_{L1B}$, $124_{L2A}$, and $124_{L2B}$ respectively as input signals, in accordance with some embodiments. A tracking bit connection line TBCL connects $TBL_R$, $TBL_R'$, $TBL_L$, and $TBL_L'$ and the outputs of the 8 tracking cells are sent to TBCL to provide inputs to a tracking LIO 106' (described below) to generate a tracking-cells output signal 415, as shown in FIG. 6. The output signal 415 is then sent to a tracking global bit line driver (TGBLD) 450, which transform the output signal 415 into a global tracking result signal 416. Signal 416 reaches GIO circuits 116 to become a read reset signal 417. The read reset signal 417 is supplied to CLK GEN 210 to initiate next read signal.

FIG. 7 illustrates a more detailed view of a portion of memory segment $104_1$ of array 100, in accordance with some embodiments. Tracking columns 120 (including $120_{TR}$ and $120_{TL}$ with tracking cells) also include a plurality of memory cells 122 aligned in a plurality of rows coupled to a tracking LIO 106'. Each of tracking columns $120_{TR}$ and $120_{TL}$ includes two tracking memory cells 124 coupled to a tracking bit connection line ("TBCL"), in accordance with some embodiments. In the embodiments described here, the tracking memory cells 124 are placed right below LIO 106' and are connected to LO_TBL. However, they can also be placed above LIO 106'.

Tracking cells $124_{R1A}$, $124_{R1B}$, $124_{L1A}$, and $124_{L1B}$ are placed next to LIOs 106' due to limited space in other regions of the array 100 and also to be close to other memory cells 122. For advanced memory circuits with high density of memory cells, real-estate in the memory array is valuable and limited. The areas near LIOs and control region 107 have more room than areas with memory cells. Therefore, tracking cells $124_{R1A}$, $124_{R1B}$, $124_{L1A}$, and $124_{L1B}$ are placed right next to the control region 170, which has decoders 112, LCTRL 114, etc.

FIG. 7 shows 4 tracking cells $124_{R1A}$, $124_{R1B}$, $124_{L1A}$, and $124_{L1B}$, in accordance with some embodiments. There are 4 additional tracking cells $124_{R2A}$, $124_{R2B}$, $124_{L2A}$, and $124_{L2B}$ arranged in a similar manner in segment 2 (not shown here). As shown in FIG. 7, segment $104_1$ includes dummy columns $118_D$ and tracking columns, $120_{TR}$ and $120_{TL}$, of memory cells 122 and tracking cells, $124_{R1A}$, $124_{R1B}$, $124_{L1A}$, and $124_{L1B}$, which are coupled to LIOs 106 and 106' respectively. Memory cells 122 disposed in dummy columns $118_D$ disposed above LIOs 106 are coupled to read bit lines UP_TBL$_R$' and UP_TBL$_L$', and memory cells 122 disposed in dummy columns $118_D$ below the LIOs 106 are coupled to read bit lines LO_TBL$_R$' and LO_TBL$_L$'. The configuration shown in FIGS. 6 and 7 shows that tracking cells, $124_{R1A}$, $124_{R1B}$, $124_{L1A}$, and $124_{L1B}$, are located below LIOs 106'. However, these tracking cells may also be located above LIOs 106', as mentioned above.

The read tracking bit line LO_TBL$_R$ is connected to the adjacent dummy read tracking bit line LO_TBL$_R$' to double the loading of (local) tracking bit line ($TBL_R$). As shown in FIG. 7, tracking cells $124_{R1A}$ and $124_{R1B}$ are placed in the SRAM array 100 in a manner similar to regular memory cells 122 to mimic regular memory cells 122. Tracking cells $124_{L1A}$ and $124_{L1B}$ on the left side of segment 104 are placed and connected in a manner similar to tracking cells $124_{R1A}$ and $124_{R1B}$ on the right side of segment 104. FIG. 7 also shows that the read tracking bit lines, LO_TBL$_R$, LO_TBL$_R$', LO_TBL$_L$, and LO_TBL$_L$' of FIG. 7 (identified as $TBL_R$, $TBL_R$', $TBL_L$, and $TBL_L$' in FIG. 6) are connected to TBCL. FIG. 7 further shows that the read bit lines, UP_TBL$_R$, UP_TBL$_R$', UP_TBL$_L$, and UP_TBL$_L$' of columns $118_D$, $120_{TR}$ and $120_{TL}$ are also connected to TBCL.

Similarly, the outputs of tracking cells $124_{R2A}$, $124_{R2B}$, $124_{L2A}$, and $124_{L2B}$ in segment $104_2$ are also connected to their respective read tracking bit lines LO_TBL$_R$, LO_TBL$_R$', LO_TBL$_L$, and LO_TBL$_L$' of 2nd segment. LO_TBL$_R$, LO_TBL$_R$', LO_TBL$_L$, and LO_TBL$_L$', and UP_TBL$_R$, UP_TBL$_R$', UP_TBL$_L$, and UP_TBL$_L$' of 2nd segment are also connected to TBCL (not shown) through interconnect lines. As mentioned above, TBCL accumulates the tracking result signals of the 8 tracking cells to form an overall tracking-cells output signal, which is processed by one of tracking LIOs 106', such as tracking LIO 106* of FIG. 7 to generate the tracking-cells output signal 415 described in FIG. 6. The output signal 415 is then sent to the tracking global bit line driver (TGBLD) 450, as shown in FIG. 7. In some embodiments, the tracking LIO used to generate output signal 415 is located in a segment that is farthest away from the global control ("GCTRL") circuit 110 to track the worst case of read operation. In the embodiments described here, the tracking LIO would be located in the 2nd segment.

Figure 8:
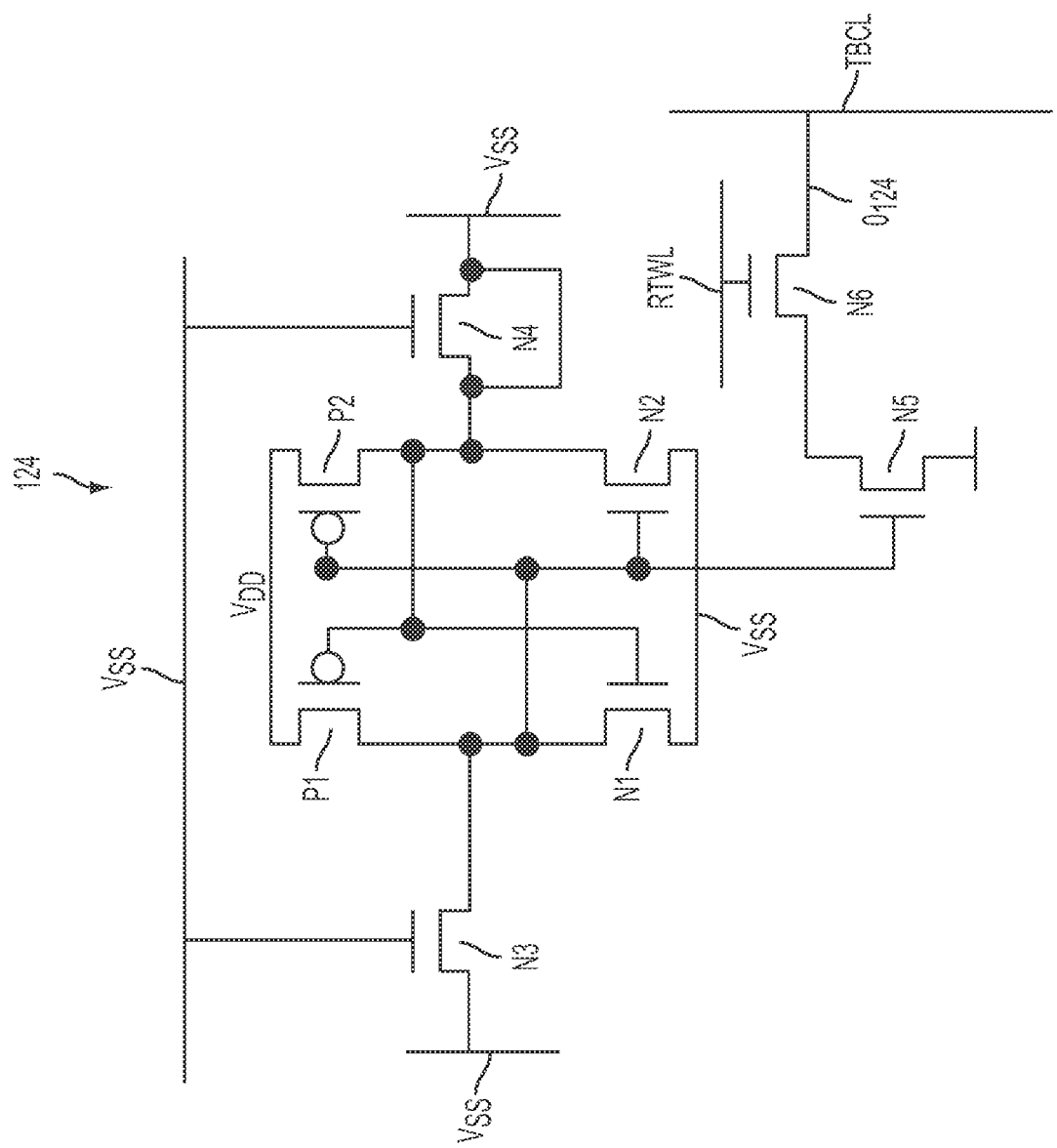
FIG. 8 is a schematic view of one example of a tracking bit cell in accordance with some embodiments.

FIG. 8 illustrates one example of a tracking cell 124, in accordance with some embodiments. As shown in FIG. 8, tracking cell 124 is similar to memory cell 122 (as depicted in FIG. 3) with the source and drain of N4 being connected. The gates of transistors P2, N2, and N5 are coupled to positive supply voltage $V_{DD}$ such that NMOS transistors N2 and N5 are always in an "on" or current conducting state and PMOS transistor P2 is always in an "off" or non-current conducting state. Further, the gates of transistors N3 and N4 are connected to $V_{SS}$. The drain of N3 could be connected to any signal, such as $V_{SS}$. The drain of N4 is connected to $V_{SS}$. The gate of N6 is electrically connected to one of read tracking word lines $RTWL_R'$ and $RTWL_L'$, which has tracking control signals $414_R$ and $414_L$, respectively (as depicted in FIG. 6). Additionally, the output ($O_{124}$) of tracking cell 124 is coupled to a tracking bit connect line (TBCL). The tracking control signals $414_L$ or $414_L$ controls the generation of the output signal, $O_{124}$, which is sent to TBCL.

Figure 9:
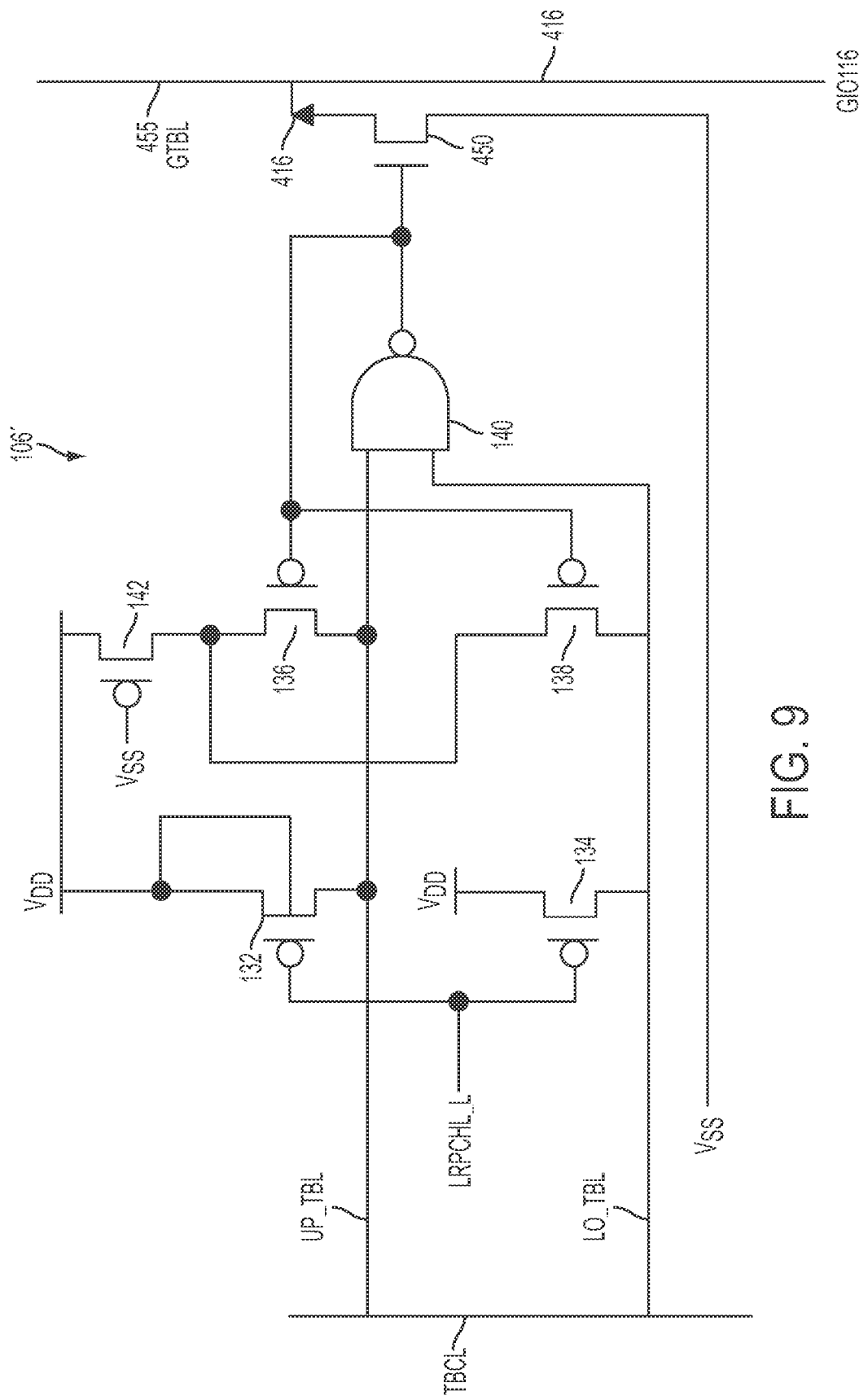
FIG. 9 illustrates a tracking local input/output circuit in accordance with some embodiments.

FIG. 9 illustrates an embodiment of the tracking LIO 106' described above, in accordance with some embodiments. LO_TBL is a first input, providing the overall tracking-cells output signal provided through TBCL, to a NAND logic gate 140 and is disposed below LIO 106' as illustrated in FIG. 7. A second input is disposed above LIO 106' and is identified as UP_TBL, which is also connected to TBCL as described above. The output of NAND logic gate 140 is signal 415, which is fed to a tracking global bit line driver (TGBLD) 450. TGBLD 450 is also coupled to VSS and a global tracking bit line (GTBL) 455. The tracking global bit line driver (TGBLD) 450 is used to mimic the timing of the global bit line driver (GBLD) 250 described in FIG. 5. The vertical distance of global tracking bit line (GTBL) 455 is about Y. Therefore, the total vertical distance traveled by the tracking signal(s) is 2Y with a margin of Y. Transistors 132-138 and 142 are coupled to positive voltage supply $V_{DD}$ and negative voltage supply $V_{SS}$ to provide the appropriate logic voltage levels to NAND gate 140. NAND gate 140 transforms tracking cell output signals from UP_TBL and LO_TBL to become tracking-cells output signal 415. As described above, UP_TBL and LO_TBL are both coupled to TBCL. Tracking-cells output signal 415 is sent to tracking global bit line driver (TGBLD) 450 to generate signal 416. Signal 416' reaches GIO circuits 116 to generate a read reset signal 417, which is shown in FIG. 6. The read reset signal 417 is supplied to CLK GEN 210 to initiate next read signal.

Figure 10:
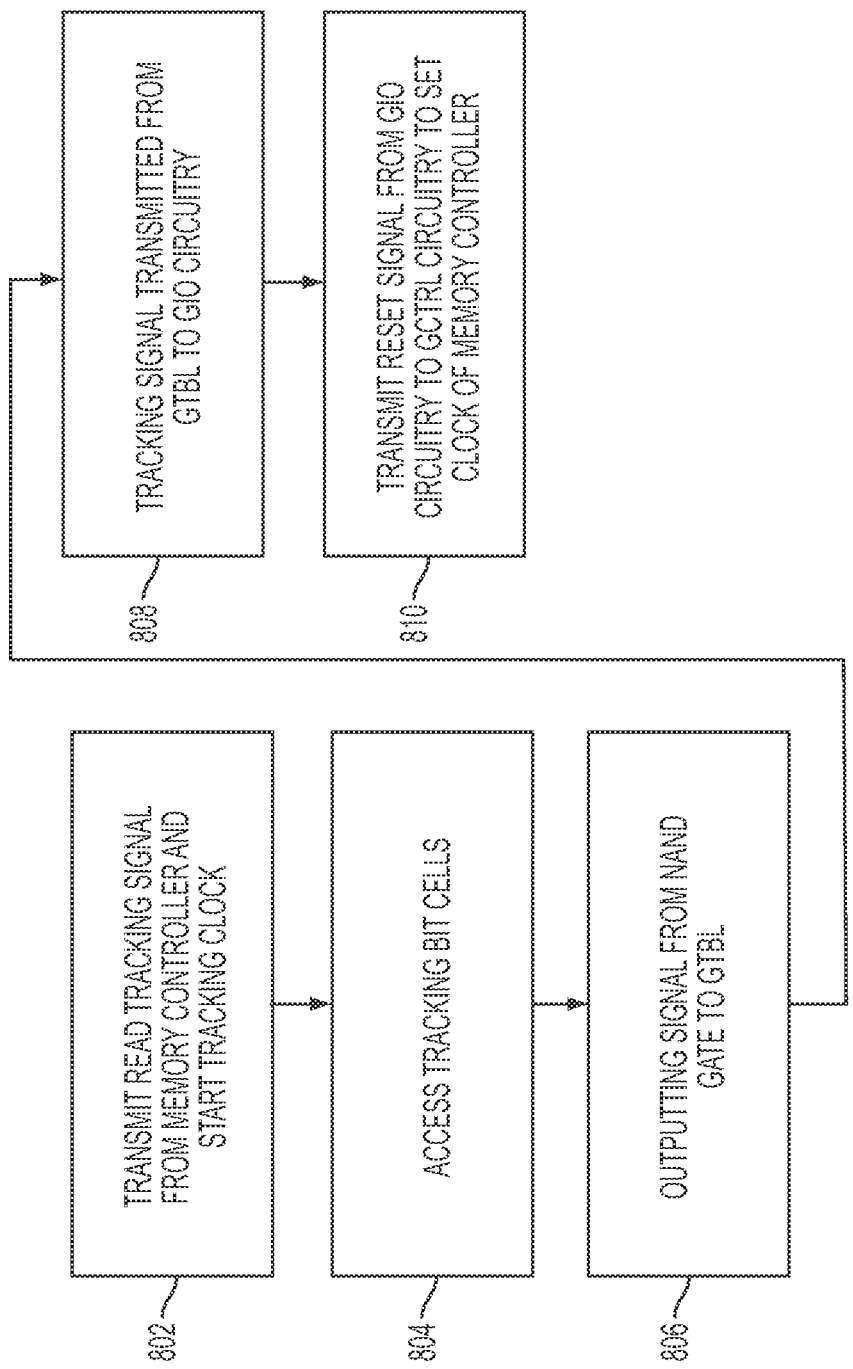
FIG. 10 illustrates a flow chart of a method of read bit line tracking in accordance with some embodiments.

FIG. 10 is a flow chart illustrating a method 800 of read bit line tracking, in accordance with some embodiments. At operation 802, a memory controller transmits a read tracking signal to start a tracking clock, such as external clock signal 211 described above at GCTRL circuitry 110. After tracking clock is started, tracking signals are generated following the paths and devices described above. At operation 804, the tracking signals reach the tracking cells. The exemplary 8 tracking cells and their arrangement and operation have been described above. At operation 806, the outputting signal, such as signal 416 described above, of a NAND gate with inputting signals from the tracking cells is sent to a global bit line, such as GTBL 455. The generation of the outputting signal from the NAND gate has been described above. At operation 808, the outputting signal of operation 806 is sent to a GIO circuitry, such as GIOs 116 described above, to become a read reset signal, such as signal 417. Afterwards, at operation 810, the read reset signal is sent to a GCTRL circuitry, such as GCTRL 110, to set clock of the memory controller.

The read tracking path 400 described above involves various signal transformations involving components, such as through components CLK GEN 210, LCLK 230, buffer 240, drivers $410_R$ and $410_L$, and GBLD 450, 8 tracking cells $124_{R1A}$, $124_{R1B}$, $124_{R2A}$, and $124_{R2B}$, $124_{L1A}$, $124_{L1B}$, $124_{L2A}$, and $124_{L2B}$, and GIOs 116. GBLD 450 is similar to GBLD 250 in read path 200. The 8 tracking cells in two segments are used to simulate the performance of memory cells 122 in different areas of SRAM 100. However, fewer or more segments may be used. For example, tracking cells may be placed in more than two segments, such as 3 or 4 segments. However, placing tracking cells in additional segments would require more power consumption, because additional buffers might be needed to enhance the input and output signals for tracking cells. In the embodiments described in FIGS. 6 and 7, the tracking cells are in segments 1 and 2. These tracking cells could be placed in segments 1 and 3, in segments 2 and 4, or in segments 2 and 3. The segments do not need to be next to each other. Placing tracking cells in more than one segment enables checking for variations from segment to segment. If the segments used for tracking cells are away from GCTRL circuit 110, a buffer might be needed to enhance signal 416 to reach GIOs 116. However, such extra buffer would increase the tracking time and could unnecessarily slow down read tracking, in some embodiments.

Figure 11D:
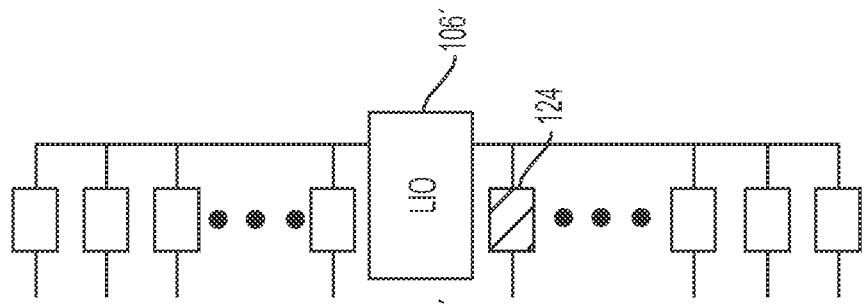
FIGS. 11A-11D illustrate 4 different arrangements of tracking cells or cell, in accordance with some embodiments.
Figure 11C:
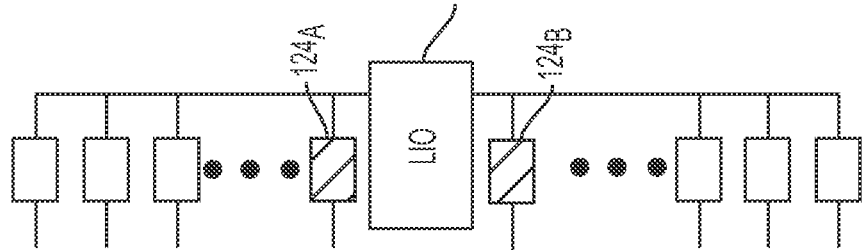
Figure 11B:
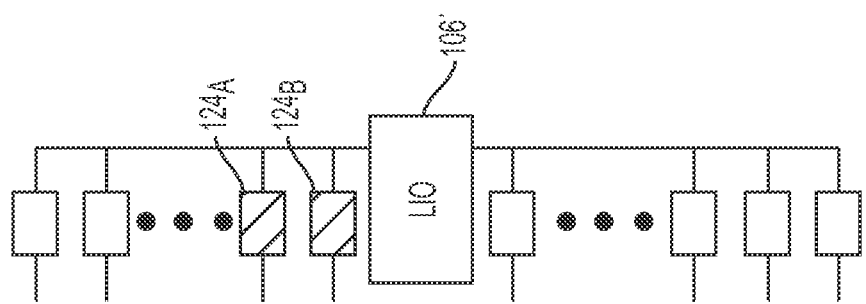
Figure 11A:
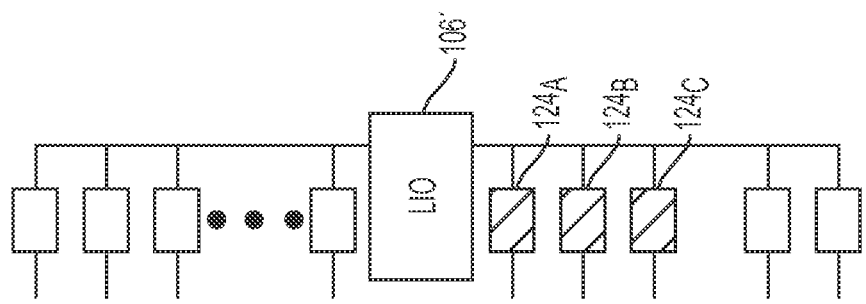

These 8 tracking cells described are placed on both left and right side of SRAM array 100 to check for device performance variation on both sides of memory array. However, the tracking cells may be placed on one side (either left or right side) of memory array. Further, different number of tracking cells may be used. For example, the number of tracking cells could be any integer number, such as 1 to 16, or more. If the number of tracking cells is too low, such as 1 or 2, the read tracking could be too fast or too slow, depending on the tracking cells used. Sufficient number of tracking cells are needed to ensure the tracking cells used cover device performance variation across the memory array. The number of tracking cells needed depends on targeted yield for the application, which is affected by PVT as mentioned above. For example, the higher the targeted yield is, the more tracking cells will be needed. In some embodiments, the number of tracking cells is in a range from 4 to 12. The number of tracking cells does not need to be even. Odd number of tracking cells may also be used. In the embodiments described in FIGS. 6 and 7, there are two tracking cells arranged next to each other, such as $124_{R1A}$ and $124_{R1B}$. However, there could be more than two tracking cells arranged next to one another. FIG. 11A shows 3 tracking cells, 124A, 124B, and 124C, arranged one on top of another and are disposed below LIO 106', in accordance with some embodiments. FIG. 11B shows 2 tracking cells 124A and 124B arranged next to each other and are disposed above LIO 106', in accordance with some embodiments. FIG. 11C shows 2 tracking cells 124U and 124D arranged on the opposite side of LIO 106', in accordance with some embodiments. FIG. 11D shows a tracking cell 124 place in a tracking column, in accordance with some embodiments. More segments and/or tracking columns may be used for the embodiments of FIG. 11D to increase the number of tracking cells. Other arrangements are also possible.

As described above, the total vertical (or in the direction parallel to word lines) distance of tracking path 400 is about 2Y, which is roughly the same vertical travel distance of read path 200, with a margin of Y. As mentioned above, read path 200 covers the worst case travel distances in horizontal and in vertical directions. The tracking path 400 has built in some margin in vertical travel distance. The extra vertical distance is 2 times the distance E between GBLD 450 and GIOs 116 and also distance Y traveled by signal 235, as shown in FIG. 6. The total horizontal (or in the direction parallel to bit lines) of tracking path 400 is about X (slightly over X), which is a same horizontal travel distance of read path 200. In addition, drivers $410_R$ and $410_L$ of tracking path 400 are used to mimic driver 240 of read path 200 and read tracking path 400. As mentioned above, GBLD 450 is used to simulate a timing of GBLD 250 in read path 200. Further, dummy columns $118_D$ are used to double the loading of $TBL_R$ and $TBL_L$ to provide provides margin for resistance-capacitance (RC) delay in the local tracking bit line.

Each component and each path could affect the read time. For advanced memory device, the requirements on the speed of read and/or write memory cells have greatly increased. As a result, some existing schemes of using extra margin for read tracking would not meet the speed requirement, because too many buffers or margins are used. A read tracking scheme that mimics a worst-case read path of memory cells 110 in array 100 with some reasonable amount of built-in margins is efficient in providing sufficient read time margin without unnecessary lengthening the read time margin to degrade the read speed. The embodiments described above provide a read tracking mechanism that mimics the worse-case read path of memory cells 122 of SRAM array 100 with some reasonable margins both in distance and in associated circuit devices. Therefore, such read tracking circuits are efficient and enable fast read for advanced memory arrays.

A read tracking system and method for advanced memory devices are provided. The read tracking system and method include tracking multiple tracking bit cells in multiple segments and columns to incorporate device performance variation of bit cells in a memory array. The tracking path mimics the worst-case read path with some built-in margins to sufficiently and efficiently cover the read times of bit cells in a memory array without unnecessarily sacrificing the read speed performance of the memory array. A number of tracking cells may be placed at different segments and both sides of the memory array to cover read time variation across memory array.

One aspect of this description relates to a memory array. The memory array includes an array of memory cells. The memory array further includes at least two read tracking cells in a read tracking column. The memory array further includes a read tracking circuit coupled to the at least two first read tracking cells, wherein the read tracking circuit is configured to generate a global tracking result signal based on outputs from the at least two first read tracking cells. The memory array further includes memory control circuitry, wherein the memory control circuitry is configured to reset a memory clock based on the global tracking result signal.

Another aspect of this description relates to a memory array. The memory array includes a global control circuit configured to generate a global clock signal. The memory array further includes a local control circuit configured to receive the global clock signal and to generate a local clock signal. The memory array further includes a driver configured to receive the local clock signal and to generate a read tracking signal. The memory array further includes a first tracking bit cell configured to receive the read tracking signal and to provide a tracking cell output signal. The memory array further includes a control circuit configured to receive the tracking cell output signal and to generate a reset signal, wherein the global control circuit is configured to reset the global clock signal in response to the reset signal.

Still another aspect of this description relates to a read tracking method of a memory array. The method includes starting a tracking clock when a tracking signal is transmitted from a memory control circuit of a memory array. The method further includes accessing at least one tracking cell in the memory array using the tracking signal. The method further includes resetting the tracking clock by using an output from the at least one tracking cell, wherein a tracking path of the tracking signal has a distance equal to a sum of twice a height of the memory array and a width of the memory array.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or operations.

What is claimed is:

1. A memory array, comprising:
an array of memory cells;
at least two read tracking cells in a read tracking column;
a read tracking circuit coupled to the at least two read tracking cells, wherein the read tracking circuit is configured to generate a global tracking result signal based on outputs from the at least two read tracking cells; and
memory control circuitry, wherein the memory control circuitry is configured to reset a memory clock based on the global tracking result signal.

2. The memory array of claim 1, wherein the read tracking circuit comprises a local input/output (LIO) circuit.

3. The memory array of claim 2, wherein each read tracking cell of the at least two read tracking cells is on a same side of the LIO circuit.

4. The memory array of claim 3, wherein the LIO circuit is connected between the at least two read tracking cells and the memory control circuitry.

5. The memory array of claim 2, wherein a first read tracking cell of the at least two read tracking cells is on an opposite side of the LIO circuit from a second read tracking cell of the at least two read tracking cells.

6. The memory array of claim 1, further comprising a second read tracking column on an opposite side of the memory control circuitry from the read tracking column.

7. The memory array of claim 6, wherein the second read tracking column comprises a plurality of second read tracking cells.

8. The memory array of claim 7, wherein the read tracking circuit comprises:
a first driver connected to the at least two read tracking cells; and
a second driver connected to the plurality of second read tracking cells, wherein the first driver is different from the second driver.

9. The memory array of claim 8, wherein the read tracking circuit further comprises a buffer configured to provide an input to the first driver, and to provide an input to the second driver.

10. The memory array of claim 1, further comprising a dummy column, wherein a tracking bit line of the dummy column is connected to the at least two read tracking cells.

11. A memory array comprising:
a global control circuit configured to generate a global clock signal;
a local control circuit configured to receive the global clock signal and to generate a local clock signal;
a driver configured to receive the local clock signal and to generate a read tracking signal;
a first tracking bit cell configured to receive the read tracking signal and to provide a tracking cell output signal; and
a control circuit configured to receive the tracking cell output signal and to generate a reset signal, wherein the global control circuit is configured to reset the global clock signal in response to the reset signal.

12. The memory array of claim 11, further comprising a second tracking bit cell configured to receive the read tracking signal, wherein the second tracking bit cell is in a column different from a column of the first tracking bit cell.

13. The memory array of claim 12, further comprising a tracking bit connection line (TBCL) connected to the first tracking bit cell and to the second tracking bit cell.

14. The memory array of claim 13, further comprising a dummy column connected to the TBCL.

15. The memory array of claim 11, further comprising a local input/output (LIO) circuit connected between the local control circuit and the first tracking bit cell.

16. The memory array of claim 15, wherein the first tracking bit cell is one of a plurality of tracking bit cells and each tracking bit cell of the plurality of tracking bit cells is located on a same side of the LIO circuit.

17. The memory array of claim 15, further comprising a second tracking bit cell on a side of the LIO circuit opposite the first tracking bit cell.

18. The memory array of claim 11, wherein a signal path length between the driver and the first tracking bit cell is equal to or greater than about a width of the memory array.

19. A read tracking method of a memory array, the method comprising:
starting a tracking clock when a tracking signal is transmitted from a memory control circuit of a memory array;
accessing at least one tracking cell in the memory array using the tracking signal; and
resetting the tracking clock by using an output from the at least one tracking cell, wherein a tracking path of the tracking signal has a distance equal to a sum of twice a height of the memory array and a width of the memory array.

20. The method of claim 19, further comprising doubling a load on a tracking bit connection line (TBCL) connected to the at least one tracking cell using a dummy column bit line.

* * * * *